United States Patent [19]

Palstra et al.

[11] Patent Number: 5,694,037
[45] Date of Patent: Dec. 2, 1997

[54] SYSTEM AND METHOD FOR CALIBRATING MULTI-AXIAL MEASUREMENT DEVICES USING MULTI-DIMENSIONAL SURFACES IN THE PRESENCE OF A UNIFORM FIELD

[75] Inventors: Thomas T. M. Palstra, New Providence; Ibrahim Emre Telatar, North Plainfield, both of N.J.

[73] Assignee: Lucent Technologies Inc., Murray Hill, N.J.

[21] Appl. No.: 506,735

[22] Filed: Jul. 26, 1995

[51] Int. Cl.[6] .......................... G01C 25/00; G01R 35/00; G01R 33/02

[52] U.S. Cl. .................. 324/202; 364/571.01; 324/244

[58] Field of Search .................... 324/202, 244, 324/247, 260; 364/571.01, 571.02, 571.07

[56] References Cited

U.S. PATENT DOCUMENTS

| | | |
|---|---|---|
| 4,109,199 | 8/1978 | Ball et al. . |
| 4,731,582 | 3/1988 | Posseme et al. . |
| 5,134,369 | 7/1992 | Lo et al. . |
| 5,182,514 | 1/1993 | Rice, Jr. ............................ 324/247 |
| 5,243,403 | 9/1993 | Koo et al. . |
| 5,287,295 | 2/1994 | Ives et al. ........................... 324/202 |
| 5,316,634 | 5/1994 | McLeod . |
| 5,373,736 | 12/1994 | Brown . |

Primary Examiner—Walter E. Snow

[57] ABSTRACT

A calibration and measurement system for a multi-axial device is disclosed which includes a memory for storing a set of test measurement values obtained from the multi-axial device in a substantially uniform field; and a calibration transformation generator for generating from the set of test measurement values to calibrate the multi-axial device, with the set of test measurement values lying on a multi-dimensional surface.

23 Claims, 3 Drawing Sheets

SYSTEM AND METHOD FOR CALIBRATING MULTI-AXIAL MEASUREMENT DEVICES USING MULTI-DIMENSIONAL SURFACES IN THE PRESENCE OF A UNIFORM FIELD

BACKGROUND OF THE INVENTION

1. Field of the Invention

This disclosure relates to the calibration of measuring devices, and particularly to the calibration of a triple axis magnetometer.

2. Description of the Related Art

Measuring devices are required to be calibrated to function accurately, especially when such measuring devices are used to perform extremely sensitive measurements of low-level effects, such as magnetic fields. In particular, multi-dimensional measuring devices use a multiple set of axes as reference frames for each dimension, where such measuring devices employ at least one sensor per axis. An example of such multi-dimensional measuring devices is the three-axis magnetometer, in which at least one sensor is deployed in each of the x, y, and z axes to measure the magnetic field along the corresponding axis.

In particular, such three-axis magnetometer systems are used, for example, to accurately detect anomalies of the Earth's magnetic field for submarine detection, oil prospecting, and the location of buried pipes, manhole covers, etc. For example, the detection of buried fiber optical cables is a major concern for maintenance and repair thereof to minimize disruption in telecommunication service. As disclosed in commonly assigned U.S. patent application Ser. No. 08/221,130, entitled "MAGNETICALLY LOCATABLE OPTICAL FIBER CABLES CONTAINING INTEGRATED MAGNETIC MARKER MATERIALS", filed Mar. 31, 1994; and in commonly assigned U.S. patent application Ser. No. 08/220,777, entitled "MAGNETICALLY LOCATABLE NON-METALLIC OPTICAL FIBER CABLES", filed Mar. 31, 1994; each application being incorporated herein by reference, the location of dielectric cables may be facilitated by the addition of a magnetic signature that codes the cables to allow magnetic detection. The magnetic anomalies relative to an ambient magnetic field, for example, the Earth's ambient magnetic field, are generated by the magnetically coded fiber optic cable which are small compared with the ambient Earth's magnetic field of about 0.5 Oersted (Oe), making detection often very difficult.

For portable measuring and detection devices for detecting and locating magnetic cables, uniaxial sensors are generally used in a gradiometer configuration to measure such magnetic cables by measuring the difference in magnetic field using two sensors separated by a predetermined distance along a support structure. Accordingly, the sensitivity of the measuring device is usually limited by alignment of the two sensors. Typically, an alignment which is off by about 0.1 degrees limits the accuracy of the sensor to about $10^{-3}$ Oe. Furthermore, the device is susceptible to errors from, for example, the bending and flexing of the support structure of the two sensors. Devices using uniaxial sensors may exhibit such errors due to misalignment which generally may not be compensated.

In a triple axis measurement employing a plurality of uniaxial sensors, such sources of error are encountered as well. However, these errors in the triple axis measurements may be compensated by test measurements of the overall magnetic field intensity. In the prior art, a magnetic field environment may be generated by specialized magnetic field generating equipment, and accurate positioning of the sensors with respect to the magnetic field direction is performed to calibrate the triple axis magnetometer. This calibration may be represented by a calibration matrix, which may also be referred to as an error matrix, particular to the triple axis magnetometer. The calibration matrix is then used to compensate for the errors.

SUMMARY

It is herein recognized that calibration of such sensors may be performed by utilizing a substantially uniform field such as the Earth's ambient magnetic field to generate a calibration transformation associated with the measuring device. A calibration and measurement system for a multi-axial device is disclosed which includes a memory for storing a set of test measurement values obtained from the multi-axial device in a substantially uniform field; and means for generating the calibration transformation from the set of test measurement values to calibrate the multi-axial device, wherein the set of test measurement values lie on a multi-dimensional surface.

BRIEF DESCRIPTION OF THE DRAWINGS

The features of the disclosed calibration and measurement system and method will become more readily apparent and may be better understood by referring to the following detailed description of an illustrative embodiment of the present invention, taken in conjunction with the accompanying drawings, where.

DESCRIPTION OF THE PREFERRED EMBODIMENTS

Figure 1:
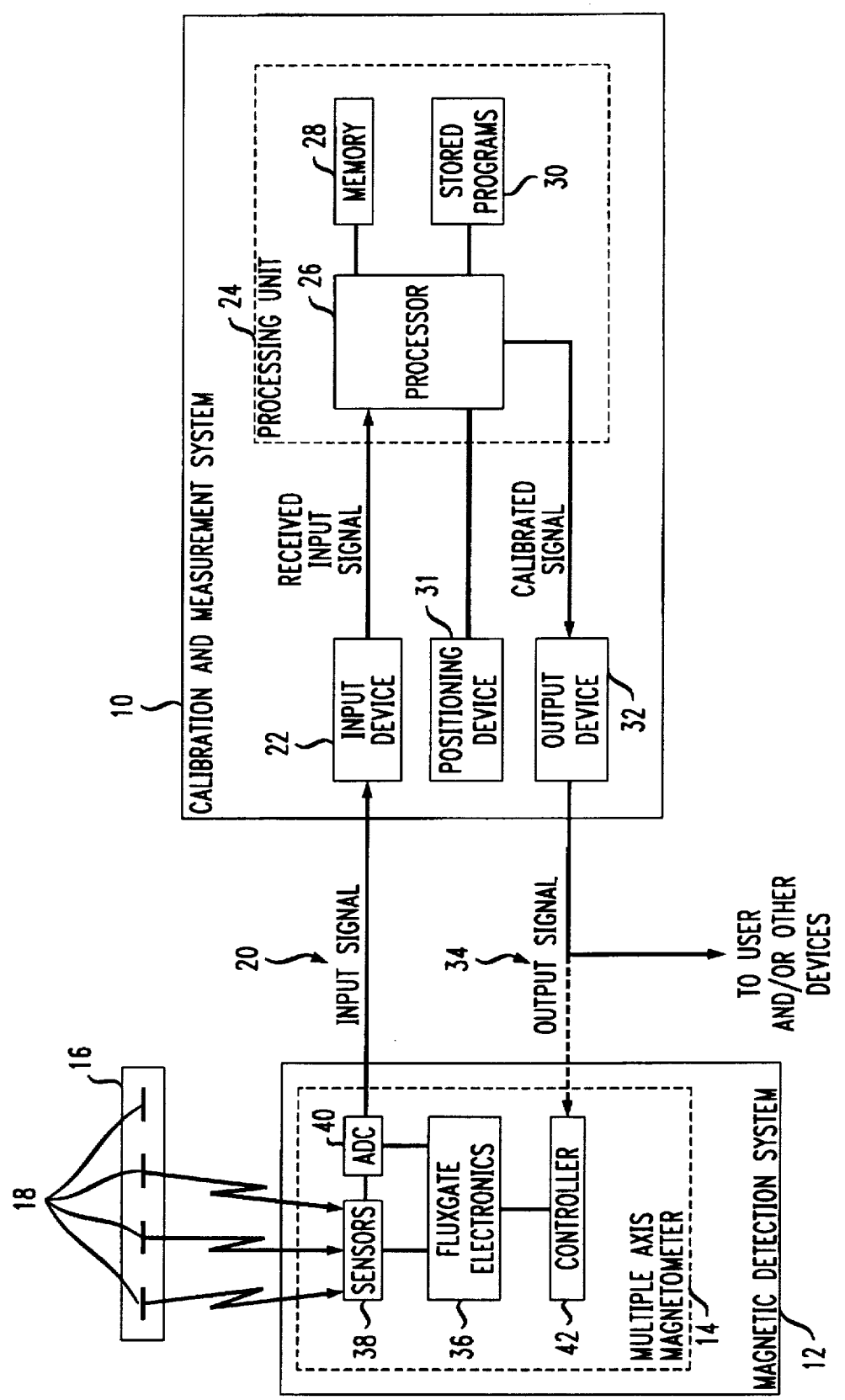
FIG. 1 illustrates a block diagram of the disclosed calibration and measurement system.

Referring now in specific detail to the drawings, with like reference numerals identifying similar or identical elements, as shown in FIG. 1, the present disclosure describes a calibration and measurement system 10 and method for correcting systematic errors in measurements obtained from multiple axis measuring devices.

The disclosed calibration and measurement system 10 and method is herein described in an exemplary embodiment as shown in FIG. 1 for calibrating a magnetic detection system 12 having a triple-axis fluxgate magnetometer 14 to permit accurate magnetic detection of fiber-optical cables 16 having a predetermined magnetic signature 18.

The disclosed calibration and measurement system 10 generates a calibration matrix and calibrated values, which may be in the form of signals, from an input signal 20, including data, such as a set of test measurement values and data measurement values, and commands obtained interactively from a user. The disclosed calibration and measurement system 10 receives the input signal 20 from an input device 22, which may include a serial port and connections to the magnetic detection system 12 as well as a keyboard, a mouse, and/or a data reading device such as a disk drive for receiving the input signal 20 in input data files from storage media such as a floppy disk, a hard or fixed disk drive, or an 8 mm storage tape.

The input device 22 sends the input signal 20 to processing unit 24, which includes a processor 26 connected to associated memory 28 and stored programs 30. The disclosed calibration and measurement system 10 may also allow the user to input operating parameters such as a command instructing the disclosed calibration and measurement system 10 to generate the calibration matrix. In an exemplary embodiment, the processing unit 24 is an INTEL™-based 80386SX computer having about 4 MB associated RAM memory and a hard or fixed drive as memory 28.

In the exemplary embodiment, the processor 26 operates using the MS-DOS 5.0 operating system, available from MICROSOFT™, to run application software as the stored programs 30 providing programs and subroutines implementing the disclosed calibration and measurement system 10 and method.

For clarity of explanation, the illustrative embodiment of the disclosed calibration and measurement system 10 and method is presented as having individual functional blocks, which may include functional blocks labelled as "processor" or "processing unit". The functions represented by these blocks may be provided through the use of either shared or dedicated hardware, including, but not limited to, hardware capable of executing software. For example, the functions of the processor and processing unit presented herein may be provided by a shared processor or by a plurality of individual processors. Moreover, the use of the functional blocks with accompanying labels herein is not to be construed to refer exclusively to hardware capable of executing software.

Illustrative embodiments may include digital signal processor (DSP) hardware, such as the AT&T DSP16 or DSP32C, read-only memory (ROM) for storing software performing the operations discussed below, and random access memory (RAM) for storing DSP results. Very large scale integration (VLSI) hardware embodiments, as well as custom VLSI circuitry in combination with a general purpose DSP circuit, may also be provided. Any and all of these embodiments may be deemed to fall within the meaning of the labels for the functional blocks as used herein.

The stored programs 30 include a main calibration program written in the QUICK BASIC programming language, available from MICROSOFT™, and uses a serial protocol program to communicate with a serial port of the input device 22 to receive the input signal 20 and to generate the calibration matrix therefrom. The processing unit 24 receives the input signal 20 including about 10 readings of the magnetic field per second from the magnetic detection system 12. In the exemplary embodiment, the input signal 20 with the 10 readings may include 30 voltage readings. The number of readings provided as the input signal 20 from the magnetic detection system 12 may be limited by a predetermined input speed of the serial port of the input device 22, which is 19200 baud in an exemplary embodiment.

The operation of the main calibration program is described hereinbelow in conjunction with FIGS. 2–3, which are implemented, in an exemplary embodiment, from interpreted source code in the QUICK BASIC programming language and which may be downloaded to the processing unit 24 from an external computer. Alternatively, the source code may be implemented in the processing unit 24 as firmware, as an erasable read only memory (EPROM), etc. It is understood that one skilled in the art would be able to use other programming languages such as C++ to implement the disclosed calibration and measurement system 10 and method. The main calibration program includes software routines including a calibration matrix generation routine for determining the calibration matrix, and an analysis routine for generating a calibrated signal using the calibration matrix. For example, the calibration matrix may be applied to a set of data measurement values to obtain calibrated measurements.

The generated calibrated signal is in the form of a signal or file which is sent to an output device 32 to generate the output signal 34, which may include calibration data values, such as calibrated measurements. The output device 32 may be a display for displaying the output signal 34, and/or a printer or plotter for generating a hardcopy printout or printed graphic of the output signal 34. The output device 32 may include specialized programs such as an output graphics tool to process and display and/or print the output signal 34. In other embodiments, the output device 32 may process and output the output signal 34 as audible signals; for example, a speaker and/or a voice processor for generating audible tones output at various frequencies and volumes and/or simulated voice messages.

The output signal may also provide the output signal 34 to other devices such as a separate display, a separate audio speaker such as an audio tone generator, and a meter, such an analog and/or a digital meter, employed by a user. Alternatively, the output device 32 may include connections to the magnetic detection system 12, and the output device 32 generates the output signal 34 corresponding to the calibrated signal.

In another embodiment, the output signal 34 may be displayed by the output device 32 in conjunction with position information as a magnetic map of the geographic area of the magnetic measurements, showing the location of detected magnetic anomalies. The position information may be obtained separately using a positioning device 31 known in the art such as ultrasonic positioning devices manufactured, for example, by SONIN; laser ranging devices; global positioning systems, etc. The positioning device 31 may be operatively connected to the processor 26 for providing the position information to be incorporated with the magnetic measurements in a graphic representation generated by the output device 32.

The magnetic detection system 12 includes the fluxgate magnetometer 14 having fluxgate electronics 36 operatively connected to sensors 38 and an analog-to-digital converter (ADC) 40. A controller 42 may be included, and, in an alternative embodiment, the magnetic detection system 12 may be operatively connected to the output device 32, as indicated by dashed lines in FIG. 1, to receive the output signal 34 at the controller 42 of the magnetometer 14. In this alternative embodiment, the controller 42 may be a microprocessor which responds to the output signal 34 to adjust the sensors 38 in their detection of the magnetic field 44 emanating from the magnetic signature 18 of the fiber optic cable 16.

In another alternative embodiment, the controller 42 may use the output signal 34 to adjust the fluxgate electronics 36. The fluxgate electronics 36 process the sensor signals from the sensors 38 and use the ADC 40 to generate the input signal 20. In the alterative embodiment, the fluxgate electronics 36, using the output signal 34, modify the generation of the input signal 20 to compensate for the calibration matrix corresponding to the calibrated signal.

The disclosed calibration and measurement system 10 and method generate the calibration matrix associated with the triple-axis fluxgate magnetometer 14, and allows the use of inexpensive magnetometers for the detection of small anomalies in the Earth's magnetic field, including anomalies as small as 0.05%. The Earth's magnetic field is herein considered to be a substantially uniform magnetic field. The magnetometer detection system 12 may be embodied as the system described in the above-referenced U.S. patent applications incorporated herein, which may be employed to successfully locate magnetic fiber-optical cables to a depth of at least 5 feet.

In an exemplary embodiment, the magnetometer 14 is a TAM 7 magnetometer, available from ULTRA MAGNETIC, and has dimensions of approximately 3×1×1 inches, which facilitates the embodiment of the magnetic detection system 12 as a portable unit for the detection of magnetic fields at a specific location. The magnetometer 14 includes the fluxgate electronics 36; three sensors 38 axially oriented for each of the x, y, and z axes; and an ADC 40. In the exemplary embodiment, the magnetometer 14 may be powered by two 12 volt batteries and consumes about 1 Watt, which permits the magnetic detection system 12 including the magnetometer 14 to be portable.

The sensors 38 have three DC outputs for generating sensor signals which are measured by a PRAIRIE DIGITAL 16 bit integrating ADC 40, using an ADC integrated circuit available from HARRIS™ Corporation having an integration time of about 1/60 sec. in an exemplary embodiment to generate digitized sensor signals as the input signal 20. The ADC 40 may also be powered by a 12 Volt battery and also consumes 1 Watt. The digitized sensor signals are fed into the serial port of the input device 20 of the disclosed calibration and measurement system 10 which uses a commercial software routine PDQCOMM available from CRESCENT SOFTWARE, INC. to act as the serial interface protocol and to operate in conjunction with the main calibration program written in QUICK BASIC.

Conventionally the sensors associated with the triple-axis magnetometer 14 are orthogonal to one another within about 2° which limits the performance of the magnetic detection system 12 to better than about 5% of the Earth magnetic field. In the disclosed calibration and measurement system 10, to obtain better resolution, the orthogonality, scaling factors, and offsets are accurately measured and represented in a calibration matrix associated with the magnetometer 14 in the ambient magnetic field of the Earth, which is considered Locally homogeneous during the calibration method performed by the disclosed calibration and measurement system 10.

Calibration techniques known in the art are typically performed using a non-magnetic building having large Helmholtz coils to generate a substantially homogeneous magnetic field. A high degree of alignment of the sensors within such a substantially homogeneous magnetic field is also typically required. The disclosed calibration and measurement system 10 and method obtains the calibration matrix for improved calibration of the magnetic detection system 12 without requiring the generation of a substantially homogenous magnetic field and without a high degree of alignment of sensors 38 therein.

Figure 2:
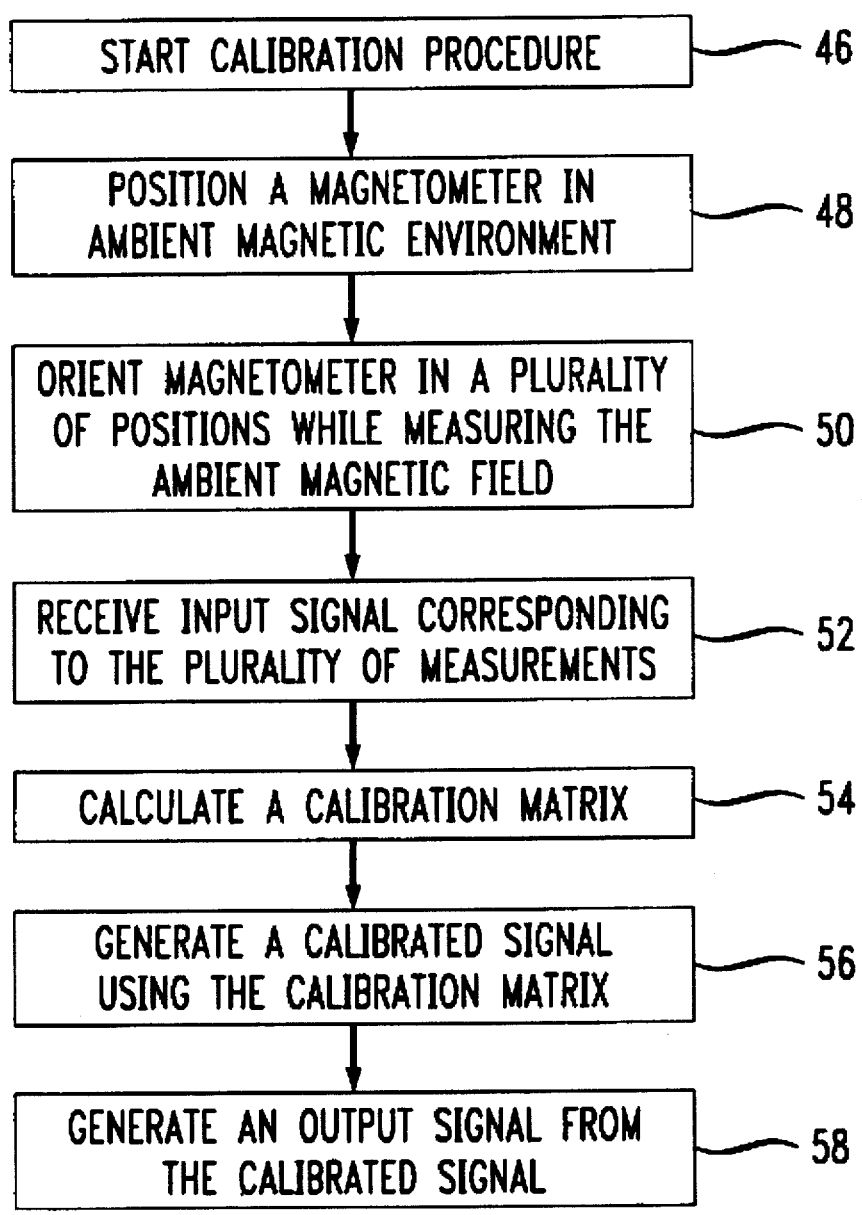
FIG. 2 shows a flowchart of a main operating procedure of the disclosed calibration and measurement system and method.

In the disclosed calibration method shown in the main operating program in FIG. 2, the disclosed calibration and measurement system 10 starts the calibration procedure in step 46, then the triple-axis fluxgate magnetometer 14 is positioned in a typical environment in step 48 having the Earth's ambient magnetic field with minimal magnetic disturbances, such as a steel pipe. The triple-axis fluxgate magnetometer 14 is then oriented in a plurality of positions in step 50 while measuring and recording the three sensor outputs using the three sensors 38. The positioning into such orientations may be performed manually or by automatic mechanisms (not shown in FIG. 1).

The disclosed calibration and measurement system 10 and method then receives the plurality of sensor measurements as the input signal 20 in step 52, and calculates the calibration matrix in step 54, including orthogonality, scale factors and offsets, wherein the magnitude of the Earth's magnetic field is considered substantially constant and substantially uniform within the ambient magnetic field during the calibrating procedure.

Using the calibration matrix, the magnetic field intensity is measured to great precision such that the same equipment may be used for both calibrating the magnetometer and measuring the magnetic field using the calibration matrix. In alternative embodiments, the disclosed calibration method may format the calibrated signal using the output device 32 to generate the output signal 34 to calibrate the magnetic detection system 12 in a manner as discussed above. The formatting of the calibrated signal may be performed such that the output signal 34 is in a form for reception and processing by the controller 42 of the magnetometer 14 for calibration thereof. Alternatively, the formatting may involve generating signals to control a display of the output device 32 to indicate calibration values corresponding to the calibrated signal, where such calibration values may be used for manually calibrating the magnetic detection system 12.

After calibration of the magnetic detection system 12 by the disclosed calibration and measurement system 10 and method, an actual magnetic field environment may then be measured for magnetic anomalies. Such a calibration method may be performed in about 2 minutes using the same magnetic anomaly detection equipment; i.e. the magnetic detection system 12 having the magnetometer 14, that is used to detect the magnetic anomalies. The calibration method may be repeated, for example, as soon as a user suspects that the calibration of the magnetic detection system 12 is no longer valid due to changes in the ambient conditions or mechanical disturbances. Due to the speed of the calibration, a user may also re-calibrate the magnetic detection system 12 from time to time just as a precaution or as a regular operating routine, where the user activates the disclosed calibration and measurement system 10 and method to re-calibrate the magnetic detection system 12.

In another alternative embodiment, the output signal 34 may be related to the spatial position of the magnetometer, using a positioning system such as the positioning device 31 which may be an ultrasonic positioning system, a laser ranging system, global positioning systems, etc., in a manner as described above. Thus, the output signal 34 may be displayed as a function of position using, for example, a contour plot, a surface plot, etc. For example, the output device 32 may include specialized programs such as an output graphics tool to process and display and/or print the output signal 34 as such contour plots and/or surface plots. In conjunction with the multi-axis device, such as the magnetic detection system 12, the calibration and measurement system 10 using the positioning device 31 and graphics provided by the output device 32 operates as a locating system for locating anomalies in the measured field, such as a magnetic field, in which such anomalies may correspond to objects, in turn located by the locating system.

In the exemplary embodiment, the three sensors 38 are in an approximately orthogonal configuration, each measuring the component of the magnetic field along its axis. In an exemplary embodiment, each sensor 38 has a linear response to a magnetic field, but each may have a different scale factor and offset. Thus, if the magnetic field vector is f, the measured values $x^{(1)}$, $x^{(2)}$, $x^{(3)}$ from the three sensors 38 are given by a measurement vector $x_m$:

$$x_m = \begin{bmatrix} x^{(1)} \\ x^{(2)} \\ x^{(3)} \end{bmatrix} = Af + b \quad (1)$$

where A is a matrix incorporating the gains and the orientations of the sensors 38 and b is a vector of the offsets of the sensors 38. A and b together form the calibration matrix [A, b]. One skilled in the art understands that, without loss of generality, A may be a lower triangular matrix after applying a change in coordinates. For example, the x-axis may be chosen to be in the direction of the first magnetometer, the y-axis may be chosen so that the second magnetometer is in the x-y plane, and the z-axis may be chosen to be perpendicular to the x-y plane. This choice of the coordinate reference system x-y-z causes the matrix A to be a lower triangular matrix.

Calibrating measurements are made in a substantially uniform ambient magnetic field while rotating the magnetometer 14. By a change in reference frame, the magnetometer 14 may be considered fixed and the magnetic field may be viewed as rotating around the magnetometer 14, and, by an appropriate choice of units, the substantially uniform ambient magnetic field strength may be set equal to 1 during the calibration measurements.

Figure 3:
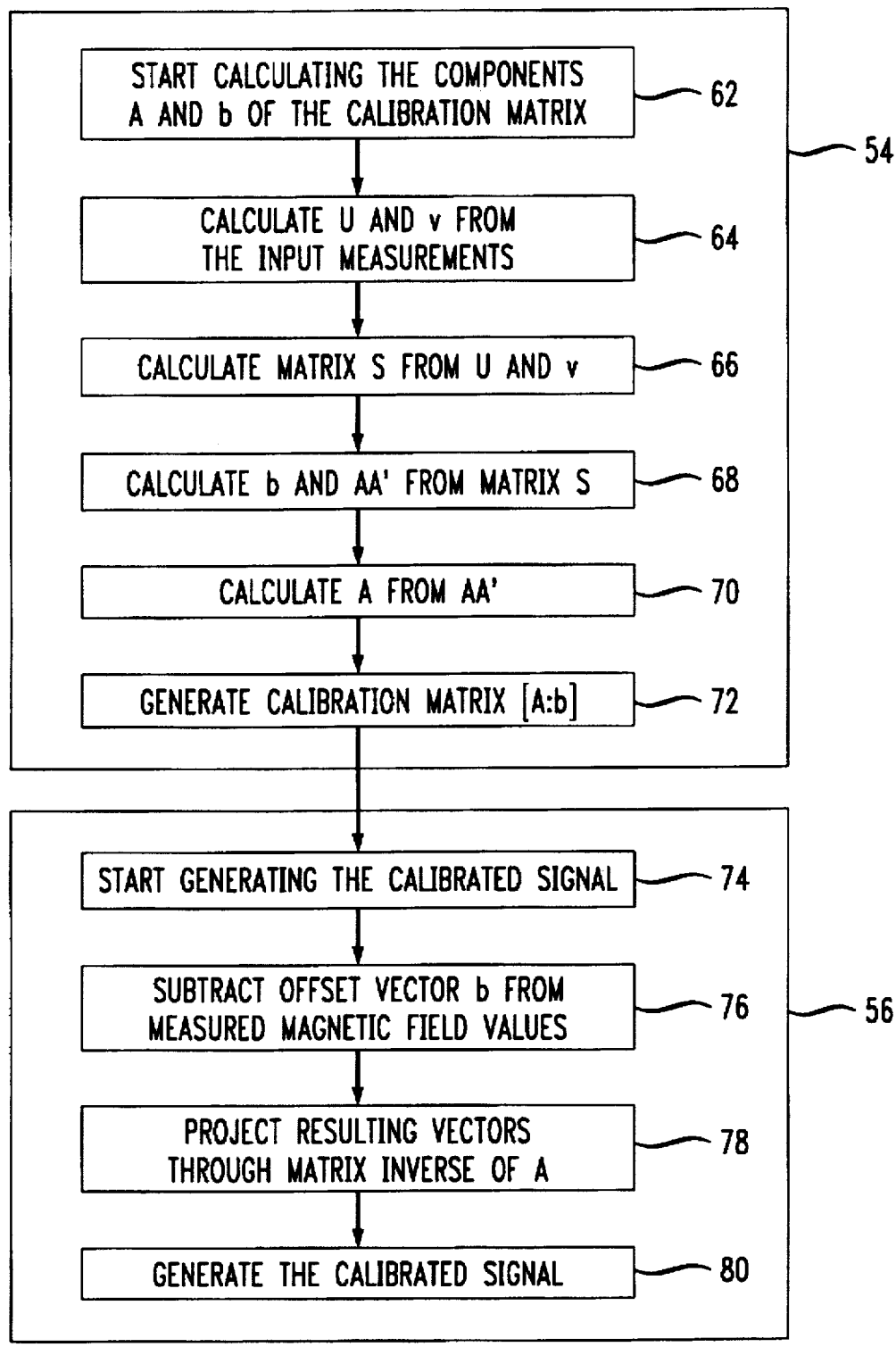
FIG. 3 shows a flowchart of the routines for generating a calibration matrix and a calibrated signal therefrom.

The step 54 of generating the Calibration matrix in FIG. 2 is shown in greater detail in FIG. 3. In FIG. 3, the processor 26 starts calculating the calibration matrix [A:b] in step 62 by calculating calibration matrix components A and b as follows. For n measurements in the above described manner; i.e. obtained during a plurality of orientations of the magnetometer 14, the measurements $x_m$ form a set of n measurement vectors:

$$\{x_1, x_2, \ldots, x_n\} \quad (2)$$

with $$x_k = Af_k + b, \; \|f_k\| = 1, \; k = 1, \ldots, n \quad (3)$$

From the set of n measurement vectors, A and b are calculated as described below. Since the $f_k$ values lie on the surface of a unit sphere of dimension D by Equation (3), and since the $x_k$ values are related to the $f_k$ values through an affine transformation by Equation (3), then the $x_k$ values lie on the surface of an ellipsoid. The parameters of the ellipsoid are then obtained from the measurements, with such parameters related to A and b. In particular, the $x_k$ values satisfy:

$$\|A^{-1}(x_k - b)\| = \|f_k\| = 1 \quad (4)$$

where $x_k - b$ are non-biased vectors, and thus $$x'_k(AA')^{-1} x_k - 2b'(AA')^{-1} x_k = 1 - \|A^{-1}b\|^2 \quad (5)$$

where ( )' denotes transposition.

For $\|A^{-1}b\| \neq 1$, Equation (5) is scaled by $1 - \|A^{-1}b\|^2$ in order to have the last term in Equation (5) equal to 1. After scaling, Equation (5) is transformed to:

$$\sum_{i \leq j} u_{ij} x_{ki} x_{kj} + \sum_i v_i x_{ki} = 1 \quad (6)$$

where $x_{ki}$ is the $i^{TH}$ coordinate of $x_k$, and U and v in Equation (6) are related to AA' and b of Equation (5) as described below.

The left hand side of Equation (6) is linear in the parameters U and v, so a least squares fit solution for U and v provides linear equations for U and v according to Equation (7) below:

$$\forall i \leq j: \sum_{i \leq j} \left( \sum_k x_{ki} x_{kj} x_{ki'} x_{kj'} \right) U_{i'j'} + \sum_{i'} \left( \sum_k x_{ki} x_{kj} x_{ki'} \right) v_{i'} = \sum_k x_{ki} x_{kj} \quad (7)$$

$$\forall i: \sum_{i' \leq j'} \left( \sum_k x_{ki'} x_{kj'} x_{ki} \right) U_{i'j'} + \sum_{i'} \left( \sum_k x_{ki'} x_{ki} \right) v_{i'} = \sum_k x_{ki}$$

Accordingly, the input measurement values are used in step 64 to generate $U_{ij}$ and $v_i$ from the linear equations in Equation (7). An intermediate matrix S is constructed in step 66 with elements $s_{ij}$ such that $s_{ii} = U_{ii}$ and $s_{ij} = s_{ji} = U_{ij}/2$ for i<j. Then, b and AA' are calculated in step 68 according to:

$$b = -\tfrac{1}{2} S^{-1} v \text{ and } AA' = (1 + \tfrac{1}{4} v' S^{-1} v)^{-1} S^{-1} \quad (8)$$

From the second term in Equation (8), A is obtained in step 70 by matrix manipulation methods known in the art since A is a lower triangular matrix with a non-negative diagonal. The calibration matrix [A:b] is then generated in step 72 from A and b generated in steps 62–70 according to the above equations, in which A incorporates the non-orthogonality of the physical arrangement of the three sensors 38 and also the differences in the gains of the sensors 38, and in which the vector b incorporates the offsets of the three sensors 38 from the measurement data.

In use, the disclosed calibration and measurement system 10 and method may be executed in a predetermined amount of memory, since the individual measurements are not required to be stored. It is also estimated that relatively few computations are required; for example, approximately 100 floating point operations per data vector and approximately 1000 floating point operations are performed after the data is accumulated.

One having ordinary skill in the art would understand that the operation of the disclosed system and method may be modified such that the calibration parameters are updated after each measurement. In addition, the dimension D and number of associated axes may be greater than or equal to 1, and Equations (1)–(8) may be applied without alteration by using vectors and matrices reflecting such higher dimensions.

Once the generation of the calibration matrix is performed, the disclosed calibration and measurement system generates the calibrated signal using the calibration matrix in step 56 of FIG. 2, which is shown in greater detail in FIG. 3, by starting in step 74 for adjusting the received measurement values therefrom. For each measurement vector x, the offset vector b is subtracted in step 76, and the resulting vector is projected through $A^{-1}$ in step 78 to undo the effects of non-orthogonality and non-identical gains and to obtain the magnetic field having a reduced or zeroed-out error by calibration. That is, applying Equation (1) and the calculated values of the calibration matrix [A:b] from Equations (4)–(8) above, the actual magnetic field is:

$$f = A^{-1}(x - b) \quad (9)$$

which may be measured and displayed or otherwise output to a user through the output device 32.

The calibration adjustment to the actual magnetic field is generated as the calibrated signal in step 80 as:

$$\|f\| - 1 = \|A^{-1}(x - b)\| - 1 \quad (10)$$

which is the difference of the strength of the actual magnetic field from the magnetic field strength of the calibration environment, since the calibration environment is scaled to have a magnetic field strength of 1. The actual magnetic field f and the calibration adjustments according to Equations (9)–(10) may then be displayed or otherwise output to the user through the output device 32 to accurately detect and indicate such magnetic anomalies.

While the disclosed calibration and measurement system and method have been particularly shown and described with reference to the preferred embodiments, it is understood by those skilled in the art that various modifications in form and detail may be made therein without departing from the scope and spirit of the invention. For example, the disclosed calibrating system and method may also be applied to other multiple axis devices for measuring fields, such as electrical fields, gravitational fields, etc.

The present disclosure describes an exemplary embodiment of a calibration method for use with magnetic fields. One skilled in the art would understand that the disclosed method may be applicable for use with other types of fields, such as electric fields, gravitational fields, etc. Furthermore, the disclosed method allows for calibration in fields in any number of dimensions; for example, two coupled triple axis magnetometers may be represented by a six dimensional model.

In addition, the disclosed calibration and measurement system and method are not restricted to three dimensional fields, and may be employed for any number of dimensions greater than or equal to 1. Accordingly, modifications such as those suggested above, but not limited thereto, are to be considered within the scope of the invention.

Furthermore, even though the disclosed calibration system is described in the case of a linear measurement device, the idea underlying the invention is equally applicable to non-linear measurement devices. In such a case, the measurement device yields a measurement value x from the actual field vector f according to:

$$x=g(f)$$

where g is the possibly non-linear transfer function of the measurement device. When test measurements are made in a plurality of directions in a substantially uniform field, the test measurement values will lie on a multi-dimensional surface which is the image of the sphere under the function g. If the form of g is known, then an estimate of g may be made from the multi-dimensional surface to enable the determination of a calibration transformation that yields the magnitude of f from a given g(f).

For example, if g is known to be linear, it must be of the form g(f)=Af+b for some matrix A and some vector b. Then, as described above, the calibration matrix [A:b] can be determined by finding the ellipsoid upon which the measurement values lie, and the calibration transformation includes, first, subtracting b from the measurement x=g(f), multiplying the resulting difference by the matrix inverse of A, and finally taking the magnitude of the resultant vector to obtain the magnitude of the unknown field f. This calibration transformation that results when g is known to be linear will be called the linear calibration transformation.

What is claimed is:

1. A calibration and measurement system for a multi-axial device, the calibration and measurement system comprising:
   an input device for receiving a set of test measurement values which lie on a multi-dimensional surface, wherein the multi-dimensional surface extends in at least three dimensions;
   a memory for storing the set of test measurement values obtained from the multi-axial device in a substantially uniform field; and
   means for generating a calibration transformation from the set of test measurement values to calibrate the multi-axial device from the set of test measurement values lying on the multi-dimensional surface, wherein the multi-dimensional surface extends in at least three dimensions.

2. A calibration and measurement system for a multi-axial device, the calibration and measurement system comprising:
   a memory for storing a set of test measurement values obtained from the multi-axial device in a substantially uniform field; and
   means for generating a calibration transformation from the set of test measurement values to calibrate the multi-axial device, wherein the set of test measurement values lie on a multi-dimensional surface which is determined by a least squares fit to the set of test measurement values.

3. A calibration and measurement system for a multi-axial device, the calibration and measurement system comprising:
   a memory for storing a set of test measurement values obtained from the multi-axial device in a substantially uniform field; and
   means for generating a calibration transformation from the set of test measurement values to calibrate the multi-axial device, wherein the set of test measurement values lie on a multi-dimensional surface, wherein the generating means generates a linear calibration transformation by approximating the multi-dimensional surface by a multi-dimensional ellipsoid.

4. The calibration and measurement system of claim 3 wherein the memory obtains the set of test measurements made from the multi-axial device positioned in a plurality of orientations in the substantially uniform field.

5. The calibration and measurement system of claim 3 wherein the generating means applies the calibration transformation to a set of data measurement values for obtaining calibrated measurements.

6. A calibration and measurement system for a multi-axial device, the calibration and measurement system comprising:
   a position measuring instrument to determine a measurement location of the multi-axial device;
   a memory for storing a set of test measurement values obtained from the multi-axial device in a substantially uniform field; and
   means for generating a calibration transformation from the set of test measurement values to calibrate the multi-axial device wherein the set of test measurement values lie on a multi-dimensional surface, wherein the multi-dimensional surface extends in at least three dimensions, wherein the generating means generates calibrated measurements by applying the calibration transformation to a set of data measurement values, and the generating means generates a representation illustrating the calibrated measurements as a function of the measurement location.

7. A calibration and measurement system for a magnetic detection system, the calibration and measurement system comprising:
   an input device for receiving a set of test measurement values which lie on a multi-dimensional surface, wherein the multi-dimensional surface extends in at least three dimensions;
   a magnetometer for obtaining the set of test measurement values in a substantially uniform magnetic field for detection thereof;
   a memory for storing the set of test measurement values; and
   means for generating a calibration transformation from the set of test measurement values to calibrate the magnetometer, wherein the set of test measurement values lie on a multi-dimensional surface, wherein the multi-dimensional surface extends in at least three dimensions.

8. A calibration and measurement system for a magnetic detection system, the calibration and measurement system comprising:

a magnetometer for obtaining a set of test measurement values in a substantially uniform magnetic field for detection thereof;

a memory for storing the set of test measurement values; and means for generating a calibration transformation from the set of test measurement values to calibrate the magnetometer, wherein the set of test measurement values lie on a multi-dimensional surface which is determined by a least squares fit to the set of test measurement values.

9. A calibration and measurement system for a magnetic detection system, the calibration and measurement system comprising:

a magnetometer for obtaining a set of test measurement values in a substantially uniform magnetic field for detection thereof;

a memory for storing the set of test measurement values; and means for generating a calibration transformation from the set of test measurement values to calibrate the magnetometer, wherein the set of test measurement values lie on a multi-dimensional surface, and wherein the generating means generates a linear calibration transformation by approximating the multi-dimensional surface by a multi-dimensional ellipsoid.

10. The calibration and measurement system of claim 9 wherein the magnetometer is positioned in a plurality of orientations in the substantially uniform field to obtain the set of test measurements.

11. The calibration and measurement system of claim 9 wherein the generating means applies the calibration transformation to a set of data measurement values for obtaining calibrated measurements associated with the magnetometer.

12. A calibration and measurement system for a magnetic detection system, the calibration and measurement system comprising:

a magnetometer for obtaining a set of test measurement values in a substantially uniform magnetic field for detection thereof;

a position measuring instrument to determine a measurement location of the magnetometer;

a memory for storing the set of test measurement: values; and means for generating a calibration transformation from the set of test measurement values to calibrate the magnetometer, wherein the set of test measurement values lie on a multi-dimensional surface, wherein the multi-dimensional surface extends in at least three dimensions, wherein the generating means generates calibrated measurements by applying the calibration transformation to a set of data measurement values, and the generating means generates a representation illustrating the calibrated measurements as a function of the measurement location.

13. A method comprising the steps of:

receiving a set of test measurement values which lie on a multi-dimensional surface from an input device, wherein the multi-dimensional surface extends in at least three dimensions;

generating a calibration transformation from the set of test measurement values obtained from a measuring device positioned in a plurality of orientations in a substantially uniform field, wherein the set of test measurement values lie on a multi-dimensional surface, wherein the multi-dimensional surface extends in at least three dimensions; and applying the calibration transformation to data measurements values to obtain calibrated measurements.

14. A method comprising the steps of:

generating a calibration transformation from a set of test measurement values obtained from a measuring device positioned in a plurality of orientations in a substantially uniform field, wherein the set of test measurement values lie on a multi-dimensional surface, wherein the multi-dimensional surface extends in at least three dimensions;

applying the calibration transformation to data measurements values to obtain calibrated measurements;

determining a measurement location of the measuring device using a position locating instrument; and generating a representation illustrating the calibrated measurements as a function of the measurement location.

15. A method comprising the steps of:

generating a calibration transformation from a set of test measurement values obtained from a measuring device positioned in a plurality of orientations in a substantially uniform field, wherein the set of test measurement values lie oil a multi-dimensional surface, including the steps of:

generating a linear calibration transformation; and approximating the multi-dimensional surface by a multi-dimensional ellipsoid; and applying the calibration transformation to data measurements values to obtain calibrated measurements.

16. The method of claim 15 further comprising the step of:

calibrating the measuring device using the set of test measurement values.

17. The method of claim 15 further comprising the step of:

obtaining the set of test measurements using a magnetometer.

18. The method of claim 15 wherein the step of approximating the multi-dimensional ellipsoid includes the step of:

performing a least squares fit to the set of test measurement values; and determining the multi-dimensional ellipsoid from the least squares fit.

19. The method of claim 15 wherein the step of generating the calibration transformation includes the step of:

using an ambient field as the substantially uniform field.

20. The method of claim 19 wherein the Earth's magnetic field is the ambient field.

21. The calibration and measurement system of claim 3 further comprising:

means for generating an ambient field as the substantially uniform field.

22. The calibration and measurement system of claim 9 further comprising:

means for generating an ambient field as the substantially uniform field.

23. The method of claim 15 further comprising the step of generating an ambient field as the substantially uniform field.

* * * * *